(12) United States Patent
Siriburanon et al.

(10) Patent No.: US 10,992,302 B2
(45) Date of Patent: Apr. 27, 2021

(54) DETECTOR CIRCUIT

(71) Applicant: UNIVERSITY COLLEGE DUBLIN, NATIONAL UNIVERSITY OF IRELAND, DUBLIN, Dublin (IE)

(72) Inventors: Teerachot Siriburanon, Dublin (IE); Vivek Govindaraj, Dublin (IE); Robert Bogdan Staszewski, Dublin (IE)

(73) Assignee: UNIVERSITY COLLEGE DUBLIN, NATIONAL UNIVERSITY OF IRELAND, Dublin (IE)

( * ) Notice: Subject to any disclaimer, the term of this patent is extended or adjusted under 35 U.S.C. 154(b) by 0 days.

(21) Appl. No.: 16/072,833

(22) PCT Filed: Jan. 30, 2017

(86) PCT No.: PCT/EP2017/051947
§ 371 (c)(1),
(2) Date: Jul. 25, 2018

(87) PCT Pub. No.: WO2017/129824
PCT Pub. Date: Aug. 3, 2017

(65) Prior Publication Data
US 2019/0036536 A1    Jan. 31, 2019

(30) Foreign Application Priority Data

Jan. 29, 2016  (GB) ..................... 1601717
Feb. 1, 2016   (GB) ..................... 1601782

(51) Int. Cl.
*H03L 7/091*   (2006.01)
*G06F 1/03*    (2006.01)
(Continued)

(52) U.S. Cl.
CPC ............ *H03L 7/091* (2013.01); *G06F 1/0321* (2013.01); *H03L 7/085* (2013.01); *H03L 7/093* (2013.01); *H03L 7/18* (2013.01); *H03L 2207/50* (2013.01)

(58) Field of Classification Search
CPC ........................................ H03L 7/091
(Continued)

(56) References Cited

U.S. PATENT DOCUMENTS 4,475,220 A * 10/1984 Mattei ................. H04L 7/0054
                                            327/7
6,542,039 B1    4/2003 Ogura
(Continued)

FOREIGN PATENT DOCUMENTS

EP           2211468 A1    7/2010

OTHER PUBLICATIONS

International Search Report and Written Opinion for PCT/EP2017/051947 dated Apr. 24, 2017, 16 pages.
(Continued)

*Primary Examiner* — Joseph Chang
(74) *Attorney, Agent, or Firm* — Husch Blackwell LLP

(57) ABSTRACT

A waveform synthesizer comprises a controllable oscillator for generating an oscillator waveform having an oscillator cycle; a reference input for accepting a reference signal having a reference cycle; and a waveform detector coupled to said oscillator and said reference input. The waveform detector is arranged to sample said waveform in response to said reference input and to determine waveform information about said oscillator. The waveform information is operative to adjust said controllable oscillator.

19 Claims, 6 Drawing Sheets

(51) Int. Cl.
   *H03L 7/085* (2006.01)
   *H03L 7/093* (2006.01)
   *H03L 7/18* (2006.01)

(58) Field of Classification Search
   USPC ......................................................... 331/1 A
   See application file for complete search history.

(56) References Cited

U.S. PATENT DOCUMENTS

2010/0241378 A1   9/2010  Baraniuk et al.
   2013/0127648 A1   5/2013  Dedic et al.
   2014/0070859 A1*  3/2014  Waltari ................... H03L 7/091
                                                      327/158
   2015/0116018 A1   4/2015  Chen et al.
   2015/0341041 A1  11/2015  Balachandran et al.

OTHER PUBLICATIONS

Search Report for GB1601782.4 dated Sep. 23, 2016, 4 pages.
Z. Szabo et al., IEEE Transactions on Instrumentation and Measurement, vol. 52, No. 3, Jun. 2003, p. 927-931.
J. Tonami et al., IEEE Transactions on Consumer Electronics, vol. 43, No. 3, Aug. 1997, p. 934-943.

* cited by examiner (a)

(b)

(c)

DETECTOR CIRCUIT

FIELD

The invention relates to a waveform synthesizer and to a frequency synthesizer. In particular, a detector circuit for a waveform synthesizer, a method of estimating the phase and amplitude and/or frequency and/or harmonic levels of an input signal and a waveform synthesizer circuit comprising a detector are described.

BACKGROUND

Frequency synthesizers are one of the key building blocks in system-on-chips (SoCs), as well as wireless transceivers. Key requirements of frequency synthesizers are an ability to operate in a fractional operation, which offers flexibility in frequency planning and allows use of a single crystal oscillator clock as a reference clock. This results in a single chip with multi standard solution for wireline applications. Moreover, the integrated jitter or phase noise should be sufficiently low enough to support complex modulation schemes. To achieve low integrated jitter performance, a conventional phase-locked loop (PLL), as shown in FIG. 1, requires wide bandwidth to help suppressing the phase noise of an oscillator. Unfortunately, conventional PLL circuits suffer from a lack of achievable bandwidth, which is typically less than ⅒ of the reference clock due to system stability. Additionally, analog loop filters used in PLLs are not scalable as technology advances. Furthermore, leakage current can cause problems for charge pump design, requiring special attention.

Alternatively, a digital fractional-N PLL can be implemented by means of a single-point edge (i.e., phase) detection in a feedback based frequency synthesizer as shown in FIG. 2. The phase of the oscillator (i.e., variable phase) is calculated by counting the number of zero-to-one transitions at the output, while the reference phase is obtained by an accumulation of the frequency command word (FCW) on every rising edge of reference clock. The reference phase is then compared with the oscillator phase to find the residue phase error by means of a time to digital converter (TDC).

However, to achieve very low in-band phase noise, a highly precise phase digitization is required; however, the resolution of conventional time-to-digital converters (TDCs) are limited to one inverter delay, i.e., not much better than 7 ps for 28 nm CMOS technology (unless much more power is spent). Typically, an in-band phase noise of an All Digital Phase-Locked Loop (AD-PLL) can be computed as:

$$L(f)=10*\log((2\pi/12)^2(\Delta t_{res}/T_{DCO})(1/f_{REF}))  \quad (1)$$

where $\Delta t_{res}$ is the resolution of TDC, $T_{DCO}$ is the period of the oscillator, and $f_{REF}$ is the frequency of the reference clock. FIG. 3 shows the theoretical in-band phase noise limitation of an ADPLL for different resolution values of TDC. It can be observed that to achieve an in-band phase noise that is limited by the noise from the reference clock, the resolution of TDC should be lower than 0.5 ps which is a tough specification for conventional ADPLLs. Moreover, for fractional-N operation, the frequency synthesizer requires a sufficient dynamic range which results in high power consumption. Consequently, to achieve ultra-low levels of in-band phase noise and fractional spurs, a different approach yielding a sub-ps level timing resolution is required.

Conventional methods to achieve precise phase detection with large dynamic range using time-to-digital converter (TDC), e.g. an inverter chain, generally requires high power consumption for sufficient dynamic range. This is because, to increase the buffer speed with a suppression of its jitter, it requires high power consumption per stage multiplied by a large number of stages (it grows linearly with the dynamic range). Approaches to improve the resolution of the TDC to below one inverter delay, e.g., delay line, nonlinear time amplifier, requires additional power consumption and area. Moreover, it requires calibration for large dynamic range.

An alternative solution is to use a sub-sampling phase detector in a digital architecture which is composed of two mechanisms. The first step is the conversion from time to voltage domains and the second step is the conversion from voltage to digital domain using an analog-to-digital converter (ADC). In recent years, an ADC can achieve 8-bit resolution with low power consumption. Therefore, the sub-sampling architecture in digital PLL can achieve fine resolution. However, this conventional architecture is restricted to integer-N operation. In a conventional integer-N synthesizer, the resolution of the output frequency is determined by the reference frequency applied to the phase detector. So, for example, if 200 kHz spacing is required, then the reference frequency must be 200 kHz. It can be difficult to provide a stable 200 kHZ frequency source for the reference frequency, however—higher frequency sources (e.g. circa. 10 MHz) are more easily available. With this in mind, fractional-N approaches allow the resolution at the PLL output to be reduced to small fractions of the reference frequency. It is possible to generate output frequencies with resolutions of 100 s of Hz, while maintaining a high reference frequency. Approaches to achieve fractional operation in the sub-sampling architecture suffer from non-linear conversion from time to voltage domain, which limits achievable performance.

According to a first aspect of the present invention, there is provided a waveform synthesizer according to claim 1.

The waveform information is sufficient to allow the oscillator waveform to be reconstructed, together with all the important information pertaining to it.

The waveform synthesizer may be capable of determining any and all of amplitude, frequency, phase, and harmonic level of the waveform. A user may be given the option as to which of amplitude, frequency, phase, and harmonic level of the waveform are determined.

In some embodiments the waveform synthesizer comprises a frequency synthesizer.

According to a second aspect of the present invention, there is provided a frequency synthesizer according to claim 17.

In this aspect, sampling said reference signal multiple times per reference cycle may refer to sampling more than 1 reference events per reference cycle, for example 2, 3, 4, 5, 6, 7, 8, 9 or more reference events.

In such embodiments, the information extracted about the oscillator cycle (as opposed to the reference cycle) may only be frequency information. Alternatively, the frequency synthesizer may be part of a waveform synthesizer, and waveform information sufficient to reconstruct the oscillator waveform may be extracted.

According to an alternative or complimentary aspect, there is provided a method or means of oversampling a first waveform or input signal to extract multiple reference events over the course of at least one reference cycle of a second waveform or reference signal; reconstructing the waveform, typically in the digital domain to form a reconstructed signal; and determine phase, amplitude, harmonic or other relevant information from the reconstructed signal such as by comparing the reconstructed signal to the input signal.

Optional features are described with reference to the dependent claims. It can be appreciated that features described with respect to one aspect can be equally applied to the other described aspects or embodiments of the present disclosure.

Instead of exploiting only a single sample of phase information in the feedback path per reference event, the proposed waveform synthesizer makes use of oversampling and reconstruction of the input waveform in digital domain in order to extract the phase error information. This results in a significant improvement in resolution of the detector part in an all-digital waveform synthesizer. Accordingly, the waveform synthesizer may be considered to be a wave-locked loop.

Whereas a phase-locked loop (PLL) is a control system that generates an output signal whose phase is related to the phase of an input signal, a wave-locked loop is a control system that generates an output signal the waveform of which is related to the waveform of an input signal. As such, it may not be only the phase that is linked, but also at least one of amplitude and frequency (preferably both). Preferably, oscillator waveform information is converted into digital information which includes phase, frequency and amplitude information (waveform information). The input signal can therefore be reconstructed in the digital domain.

The present invention utilises whole-waveform detection rather than a single-point edge (i.e., phase, zero-crossing) detection in a feedback based waveform synthesizer. The oscillator in high-performance systems is typically LC-tank based, hence it will produce a near-perfect sinusoidal voltage. Normally, that sinusoidal waveform is converted to a digital clock through a zero-crossing slicing. Edges of such resulting variable (feedback) clock may then be compared with edges of the reference clock and the phase error signal may be created to drive the oscillator in a negative feedback manner. In this disclosure, oversampling and digitizing of the oscillator waveform may produce enough digital samples to reconstruct, now in digital domain, the waveform and compare against a model waveform y(t)=A sin(wt+phi). Such a comparison can yield information about the input waveform, such as, but not limited to, phase, $\phi$, to a much finer precision than currently achievable.

In conventional digital sub-sampling architecture, only a single sample point is used, which cannot determine precise amplitude information. In such conventional architecture, sampled voltage information is used to determine equivalent phase information. However, if there is any change in oscillation amplitude, this can alter the equivalent phase resolution and gain of the phase detector and can cause problems in terms of system stability or phase noise degradation.

Sets of sampled voltages are used to determine both phase and amplitude information. Accordingly, any changes over process-voltage-temperature variations that may alter the amplitude of the input waveform are accounted for almost instantly. As can be appreciated, the proposed wave detector circuit is therefore more robust over such process-voltage-temperature variations than conventional phase detectors, for example when an abrupt change in temperature causes a change in the amplitude of the (digitally controlled) oscillator, because the amplitude change is detected.

In this invention, instead of using only one sampled point per reference cycle, oversampling and digitizing of the oscillator waveform produces digital samples to reconstruct, in the digital domain, the waveform and to compare it against the model or reference waveform. The comparison yields such important information as phase, phi, to a finer precision than currently achievable, and also allows other information to be extracted.

As disclosed herein, firstly, phase information can be determined by a digital algorithm from a set of digital samples that resemble the input oscillator waveform instead of considering only edges. This results in a fine-resolution phase detection and better robustness on PVT variations when compared to prior art sub-sampling-based phase detectors. Secondly, frequency information can be estimated within a small number of oscillator periods of the input signal as shown in FIG. 6, for example, 1, 2 or 3 oscillator periods. This results in high-speed response which can enable faster locking time. Additionally, a set of digital samples of the input oscillator waveform can be used to estimate the amplitude of different harmonics associated with the input oscillator waveform. This can be used to fine-tune low phase noise oscillators by properly tuning harmonic contents of an oscillator as shown in FIG. 8, e.g., class-F oscillators.

Additionally, frequency and amplitude information can both be obtained within a single oscillator period of the oscillator waveform. Since the frequency information and fine phase detection can be achieved in one oscillator period, a much faster locking time can be achieved than by conventional methods. Moreover, the harmonics in the input oscillator waveform can be estimated. This allows additional calibration for an oscillator for lower phase noise performance.

Advantageously, oversampling the oscillator waveform therefore allows the frequency and amplitude information to be computed within an oscillator period. By contrast, in a conventional AD-PLL, a counter is used to sample the rising edges of all the CKV edges from an oscillator which requires at least one reference cycle to process. As such, particularly in cases in which the reference cycle is significantly longer than the oscillator cycle, the invention as described herein allows such information to be determined more quickly.

The claimed invention is NOT merely a phase detector, but a waveform detector. The phase of the waveform is just one of the parameters that is being detected, but not the only one. For example, the amplitude is also able to be detected (due to multiple detection points) as discussed above.

BRIEF DESCRIPTION OF DRAWINGS

The disclosure is described in further detail in the following by way of exemplary embodiments with reference to the accompanying drawings in which.

DESCRIPTION

Figure 1:
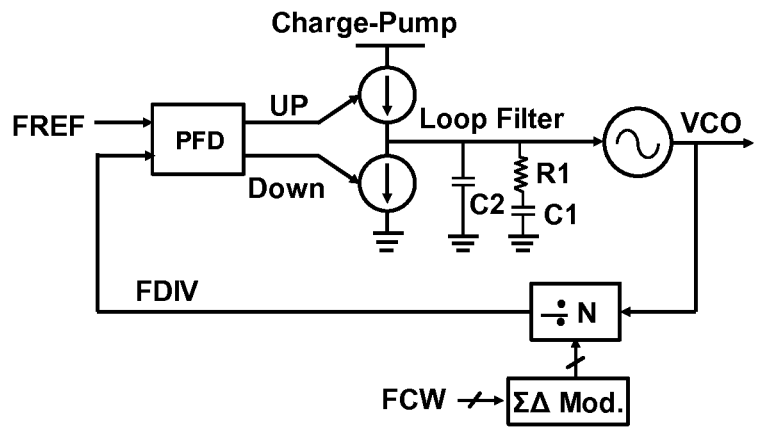
FIG. 1 is a simplified diagram of a conventional Charge-Pump PLL.
Figure 2:
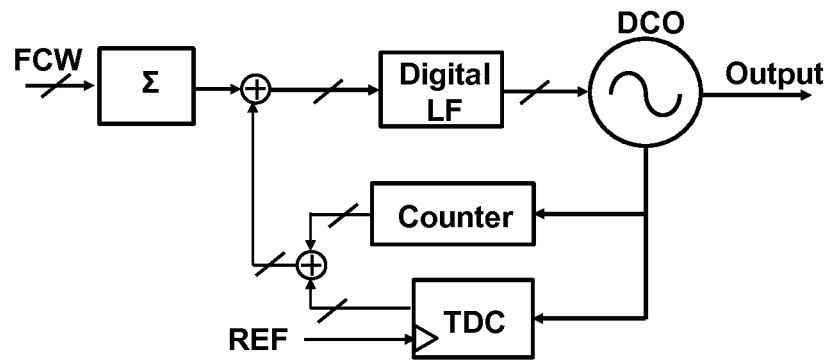
FIG. 2 is a simplified diagram of a conventional all-digital PLL (AD-PLL)
Figure 3:
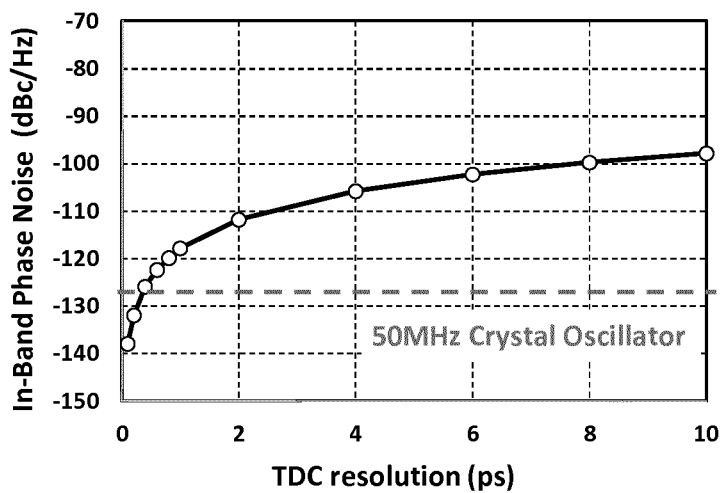
FIG. 3 is theoretical in-band phase noise limit considering the quantization noise from the TDC and reference clock.
Figure 4:
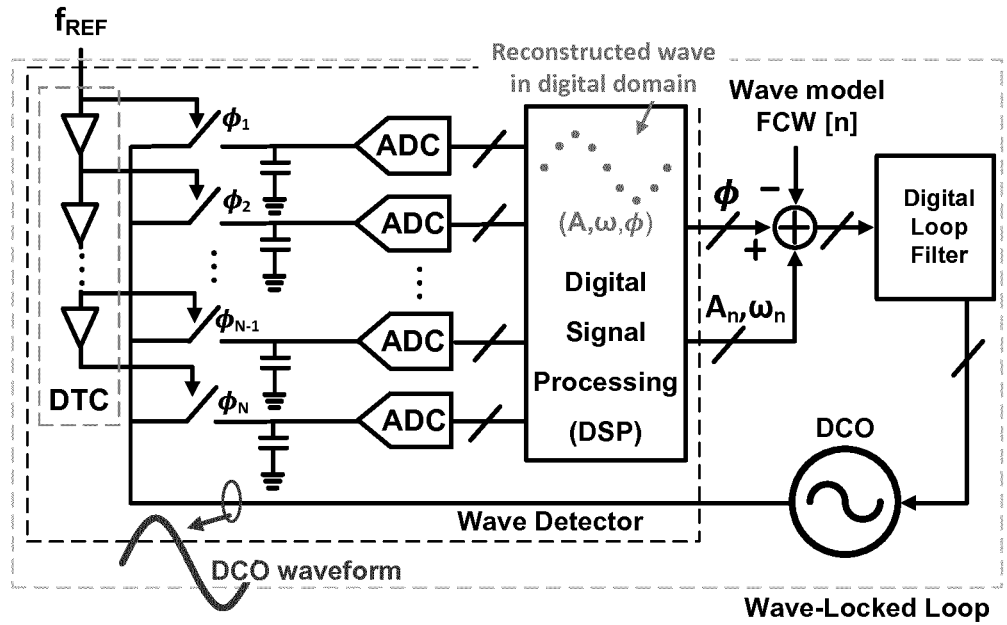
FIG. 4 is a simplified diagram of the waveform synthesizer, sometimes referred to as a wave-locked loop, according to one or more embodiments.

FIG. 4 shows a simplified circuit diagram of a waveform synthesizer circuit, sometimes referred to as a wave locked loop (WLL).

The waveform synthesizer comprises a controllable oscillator (Digitally Controlled Oscillator—DCO) for generating a waveform having an oscillator cycle, a reference input for accepting a reference signal having a reference cycle and repetition frequency $f_{REF}$, a waveform detector coupled to said oscillator and said reference input, wherein said waveform detector determines waveform information about said oscillator.

As is well known to those skilled in the art, when discussing waveforms a cycle is a complete oscillation. E.g. for a sine wave, it is the complete event starting with a rise from zero energy to a maximum amplitude, its return to zero, the rise to a maximum in the opposite direction, and then its return to zero. The "reference cycle" is the cycle of the reference signal, which is a periodic wave.

In this embodiment, the waveform information is arranged to be used to adjust the controllable oscillator (e.g., digital control for the DCO). In some embodiments, the adjusting comprises changing one or both of the frequency or a harmonic level of the controllable oscillator, which is optionally a digitally controlled oscillator, and can be a class F oscillator.

The waveform detector samples the oscillator signal multiple times per said oscillator cycle (e.g., 4 or 8). In some embodiments, said sampling of multiple times is performed at every reference cycle. Alternatively some reference cycles might be skipped or the sampling of multiple times can be repeated several times within the reference cycle, such as when triggered on both the positive and on the negative edges of the reference clock.

The waveform is sampled at a significant edge (i.e. a rising and/or falling edge) of said reference signal and at a short time afterwards Δt or Delta-t, wherein said Delta-t is less than said oscillator cycle.

The waveform is sampled at a significant edge of said reference signal and at multiple times afterwards, wherein delays between said sampling times are less than said oscillator cycle.

The waveform may be sampled at (and optionally also near, i.e. spaced by Delta-t/multiple times afterwards with delays smaller than the oscillator cycle) more than one significant edge of the same reference cycle.

The reference input is used to sample the oscillator waveform. The sampling may be vectorial, meaning that it is not just a simple sample that is taken, but rather a series of tightly spaced samples The waveform synthesizer further comprises a controller coupled to said waveform detector, said controller operational for adjusting waveform parameters of said controllable oscillator. As such, the waveform synthesizer may provide a feedback loop, adjusting the controllable oscillator based upon the determined waveform information about the oscillator waveform.

The waveform parameter is frequency in some embodiments, and in some embodiments said waveform parameter is a harmonic level.

The reference cycle is significantly longer than said oscillator cycle in some embodiments. The reference cycle may be tens-to-hundred MHz range, whereas the cycle of the input signal from the oscillator may be in the one-to-tens of GHz range, for example. A ratio of 1:10, 1:100 or 1:1000 in frequency, or therebetween, may therefore be used.

The skilled person will appreciate that such ratios apply for frequency generations using phase-locked loops which generate precise frequency/clock at higher frequency than a commercial clean reference clock from a crystal oscillator (tens-to-hundreds of MHz) which is an off-chip component. The reference cycle is the period of such a reference clock which is used as a reference to compare with more noisy signal from an oscillator on chip (typically running at several GHz or more).

The waveform information is phase information and one or more of a frequency, and an amplitude.

In some embodiments, the waveform information includes a harmonic level.

The roles of the reference and variable clocks can be reversed. The variable clock of high frequency can sample a reference waveform (sinusoidal or sinusoidal with many harmonics which make it more 'square-ish') in order to get an information about the difference between variable/reference parameters. It should be appreciated that measuring of absolute parameters, such as frequency and/or phase, is not possible without references. In one embodiment it is the reference that samples the variable quantity; in another embodiment is the variable that samples the reference quantity. What matters in the parameter detection process is the relative reference/variable relationship. In an embodiment, the invention also provides a frequency synthesizer comprising:

a) a controllable oscillator for generating a variable clock having an oscillator cycle, b) a reference input for accepting a reference signal having a reference cycle, c) a waveform detector coupled to said oscillator and said reference input, wherein said waveform detector samples said reference signal multiple times per reference cycle.

The reference cycle is significantly longer than said oscillator cycle in some embodiments, for example 10, 100 or 1000 times longer, or a value therebetween.

Each of said multiple sampling events is synchronous to said variable clock in some embodiments.

In one embodiment, the WLL receives a reference frequency, generally from a reference oscillator, such as a crystal oscillator (sometimes referred to as a XTAL), which is provided to a detector circuit, sometimes described as a wave detector, which will be described in further detail below with respect to FIG. 5. The signal generated by the reference oscillator may be referred to as a reference signal. The waveform detector provides a reconstructed waveform and phase (and/or frequency) information to a digital loop filter. The loop filter determines the dynamics of the loop based on the reconstructed waveform and phase and/or frequency information and supplies that information to a digitally controlled oscillator (DCO). The output of the DCO is then fed back to the wave detector and also used as desired.

Figure 5:
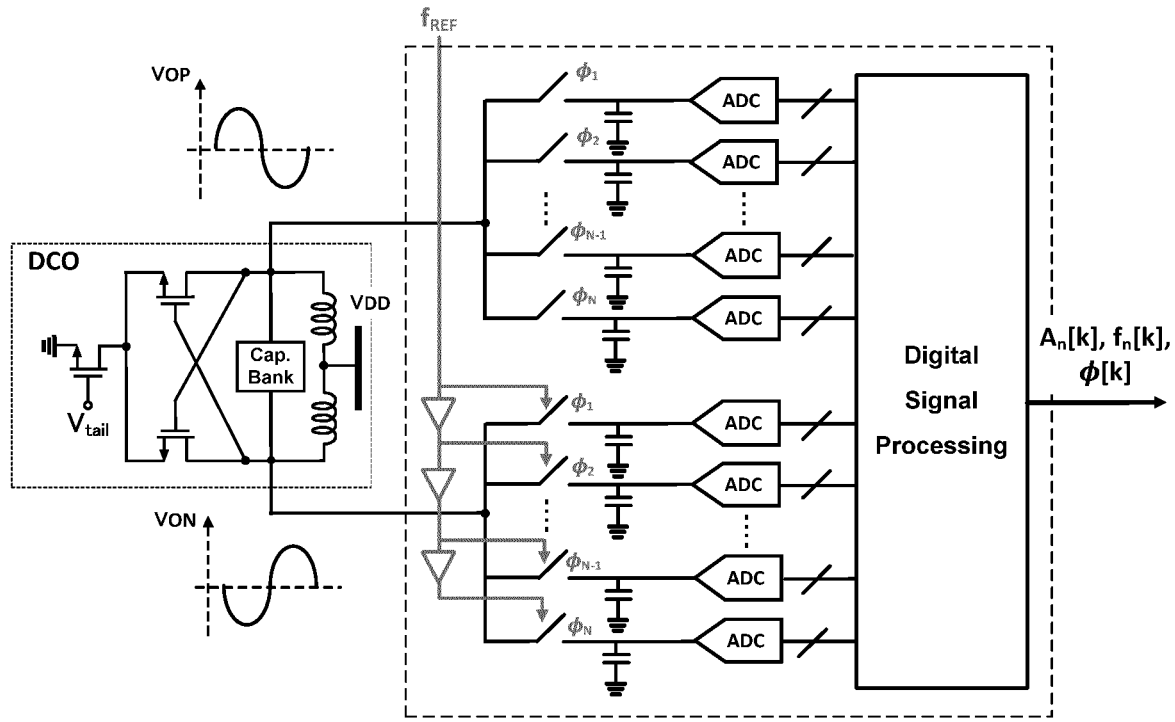
FIG. 5 is a simplified diagram of the wave-locked detector of FIG. 4 which are composed of DCO, reference delayed line, sample-and-hold circuits, ADC, and DSP block.
Figure 6:
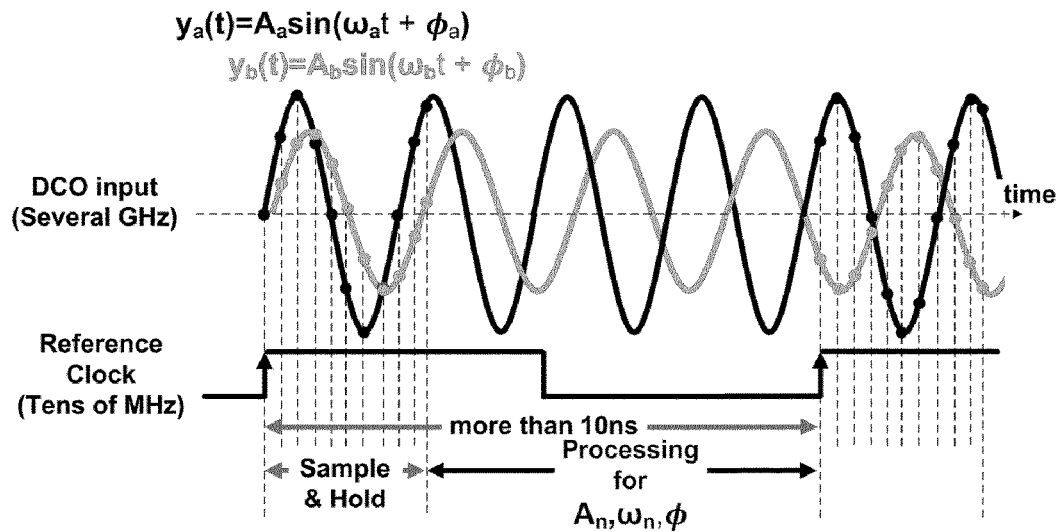
FIG. 6 is a timing diagram of the wave-locked detector of FIGS. 4 and 5.

The simplified schematic of the wave detector is shown in FIG. 5. Firstly, the output waveform from a Digitally-Controlled Oscillator (DCO), which is in GHz frequency range, is sampled into a voltage domain by a reference clock, which is further converted into digital domain by an analog-to-digital converter (ADC). Note that the sampling and quantization process can be combined. Through a set of M delayed reference clocks which can be implemented using a buffer or inverter chain, the waveform is further sampled by the ADC's and converted into M sets of digital samples. It can be appreciated that although multiple ADC's or samplers are shown for sampling the signals, specifically one ADC per branch, a single, or group of samplers may be used for each or several branches, for example one group of samplers for the DCO signal and another group for the reference signal.

Unlike conventional digital sub-sampling PLL, where only a single sample point per reference event is used to measure the phase information which put the constraint on the linearity of the conversion function and resolution of an ADC, in this invention, after M digital samples in the sample-and-hold period are captured, they are processed in the digital signal processing blocks. The digital signal processing approximates the phase through the reconstructed waveform which is much more robust over the noise or nonlinearity associated in the input waveforms. In the next section, the method of amplitude and phase approximation from the digital samples will be explained.

As mentioned earlier, the input waveform is compared with a model waveform which can be written as:

$$x = A * \sin(\omega n + \varphi) \quad (2)$$

where A is amplitude of the sinusoidal waveform, $\omega$ is the angular (or radial) oscillation frequency of the input waveform, n is the sample time index, and $\varphi$ is the phase. This equation can be rewritten using a superposition of sine and cosine function as follows:

$$x = a_1 \cdot \sin(\omega n) + a_2 \cdot \cos(\omega n) \quad (3)$$

Eq. 2 can be represented in the matrix form as:

$$H \cdot a = x \quad (4)$$

Where $x = [x_0, x_1, \ldots x_{N-1}]$; column vector of input sinusoid, $a = [a_1, a_2]$; column vector of fit parameters and H can be expressed as:

$$H = \begin{pmatrix} \sin(\omega \cdot 0) & \cos(\omega \cdot 0) \\ \sin(\omega \cdot 1) & \cos(\omega \cdot 1) \\ \vdots & \vdots \\ \sin(\omega \cdot (N-1)) & \cos(\omega \cdot (N-1)) \end{pmatrix} \quad (5)$$

By multiplying $H^T$ on both sides of Eq. (4), a can be rewritten as follows:

$$a = (H^T \cdot H)^{-1} \cdot H^T \cdot x \quad (6)$$

Eq. (3) forms N linear equations. By solving this set of linear equations, we can find the fit parameters $(a_0, \ldots a_n)$. Therefore, estimation of the amplitude and phase can be derived as follows:

$$\varphi = \tan^{-1}\left(\frac{a_2}{a_1}\right) \quad (7)$$

$$\text{amplitude} = \text{norm}(a) \quad (8)$$

where $a_1 = A \cdot \cos(\varphi)$; $a_2 = A \cdot \sin(\varphi)$. From Eq. (7), phase information can be estimated after multiplying the sampled data by the H matrix as shown in Eq. (6). In the presence of noise the sinusoidal signal can be represented as follows:

$$y[n] = x[n] + w[n] \quad (9)$$

where x[n] is signal with n samples and w[n] is associated noise. The estimation can be expressed as follows:

$$\hat{a} = a + e \quad (10)$$

where e is estimation error due to noise which is expressed as $(H^T \cdot H)^{-1} \cdot H^T \cdot w$. By assuming the noise w is white then its mean is zero with a variance of $\sigma^2$. The error covariance can be expressed as:

$$E\{ee^t\} = \sigma^2 \cdot I \cdot (H^T \cdot H)^{-1} \quad (11)$$

If the samples are separated by integer multiples of $$\frac{2\pi}{N}$$

radians, or in other words $$\frac{T_{DCO}}{N}.$$

Then, the column of H are orthogonal and $$(H^T \cdot H) = \frac{N}{2} \cdot I.$$

The error variance now can be expressed as:

$$E\{ee^t\} = \frac{2\sigma^2}{N} \cdot I \quad (12)$$

From Eq. (12), it can be observed that increasing number of samples (N) or increasing ADC resolution decreases error variance.

Figure 7:
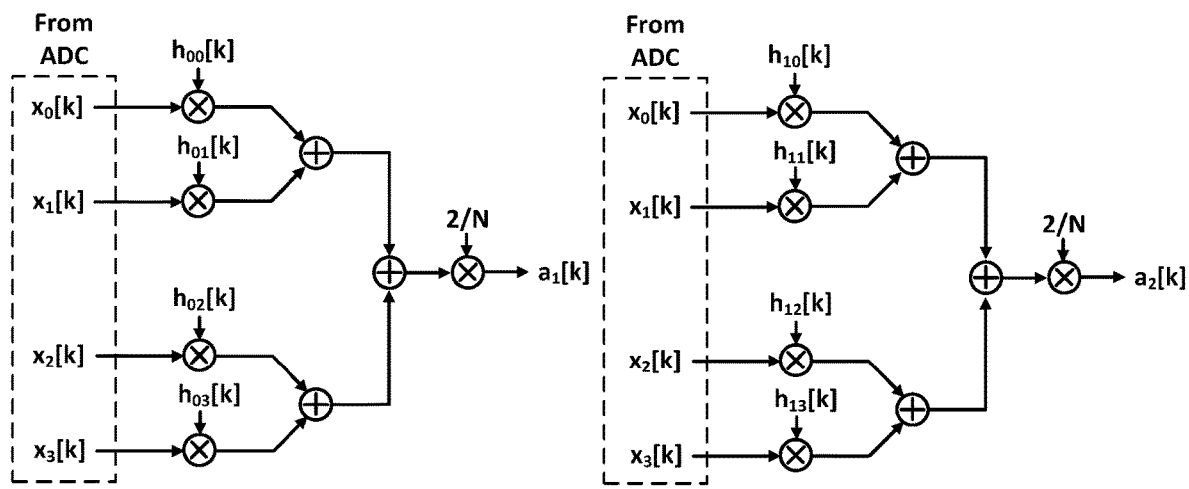
FIG. 7 is a flow chart of an algorithm for precise phase estimation derived from the wave detector describing FIGS. 4 and 5.

From the above calculation and analysis, the simplified diagram of the digital signal processing block to estimate the phase in Eq. (7) requires the calculation for a1[k] and a2[k], which are summarized in FIG. 7. The result is processed in Eq. (7) to achieve a fine phase estimation. According to simulation, using 4 samples with 4-bit ADC, phase error could be less than 1 degree which is equivalent to a time resolution of approximately 0.6 ps for 5 GHz input waveform. This equates to an in-band phase noise of −122 dBc/Hz, which is close to the theoretical limit of in-band phase noise contributed by the use of a crystal oscillator as a reference clock.

FIGS. 4-7 emphasize the detection of phase, frequency and amplitude; i.e. the waveform information detected is not just phase.

Figure 8:
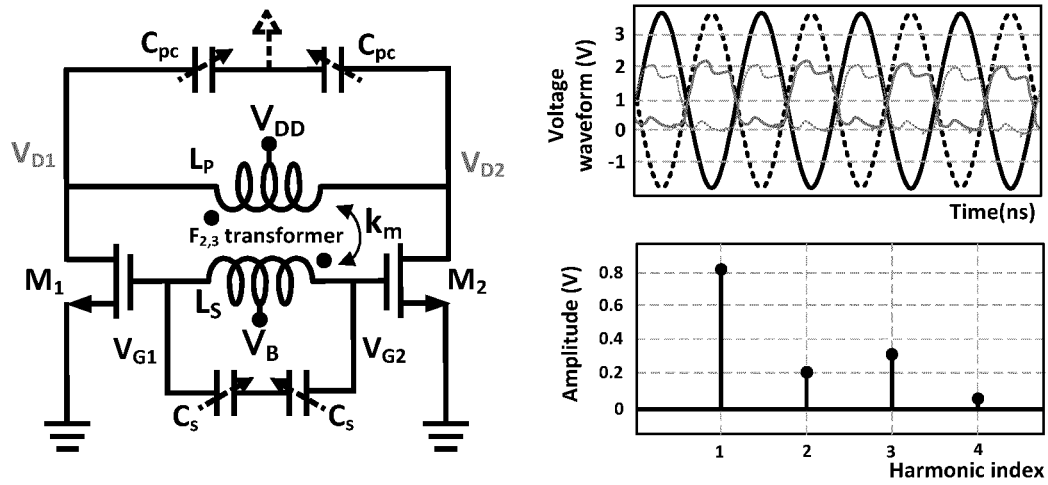
FIG. 8 shows a circuit diagram and waveform information for an example of a harmonic oscillator which may have several harmonic contents in the frequency domain.

FIG. 8 shows an example of waveform and harmonic contents of class-F oscillators. All of the waveform information depicted in the two graphs is determined by the waveform synthesizer in the embodiment being described (i.e. harmonic level including the harmonic's relative phase, amplitude, frequency, etc.).

Figure 9:
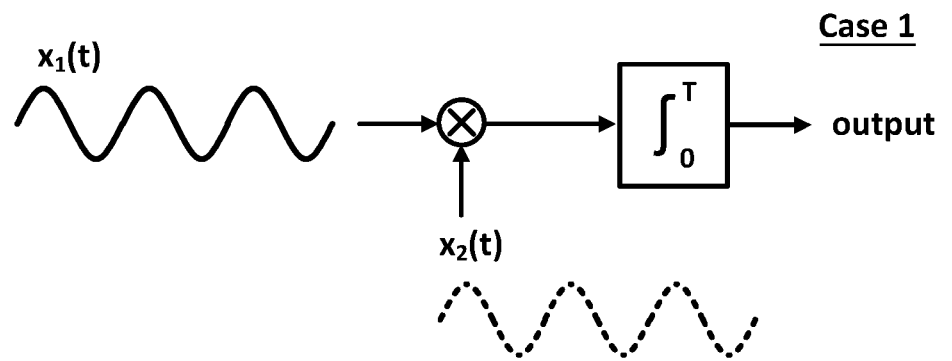
FIG. 9 shows alternatives to oversampling for the purpose of waveform detection and estimation: (a) continuous-time integration, (b) continuous-time matching of the oscillator waveform, and (c) continuous time waveform subtraction.
Figure 9:
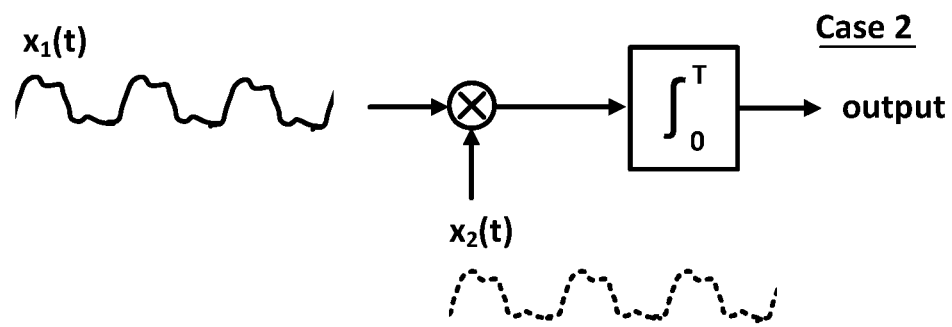
Figure 9:
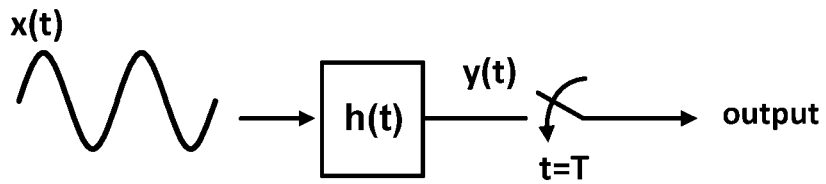
Figure 9:
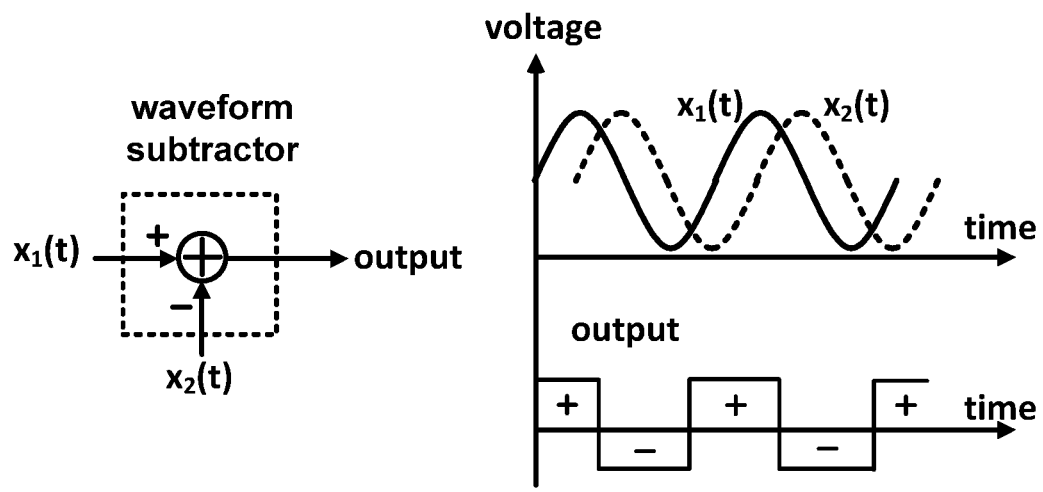

In the example embodiments described above, oversampling is used to determine waveform information. However, the invention is not intended to be limited to this and FIG. 9 illustrates examples of alternative techniques that may be used instead of oversampling. Continuous-time techniques, which are widely used in communication systems, can be used to reconstruct the waveform with its parameters. The techniques shown in FIG. 9 are:
(a) continuous-time integration;
(b) continuous-time matching of the oscillator waveform; and
(c) continuous time waveform subtraction.

The skilled person will appreciate that these options are provided by way of example only, and that any suitable technique may be used.

Figure 10:
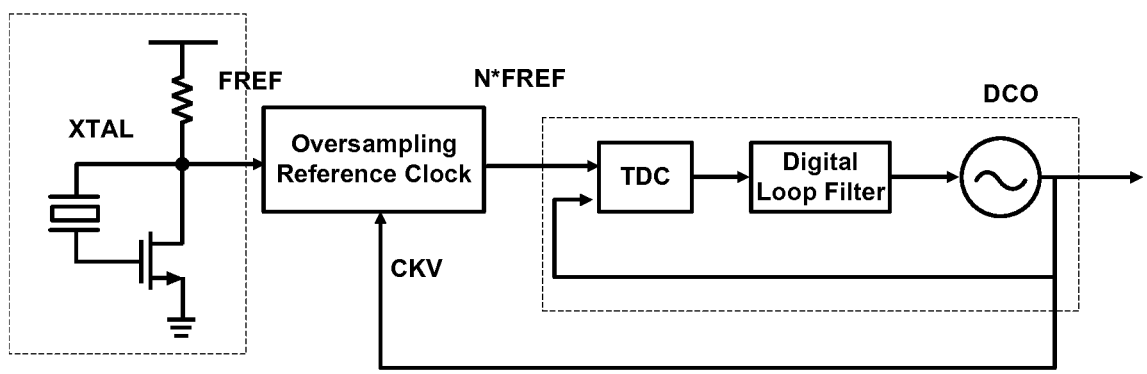
FIG. 10 shows a frequency synthesizer according to an embodiment of the invention.

The technique described above for sampling an oscillator waveform may also be applied to the reference signal. FIG. 10 illustrates a frequency synthesizer arranged to implement the invention in this fashion; the frequency synthesizer may or may not be part of a waveform synthesizer. The technique described herein can be used to oversample the reference waveform of a crystal oscillator. This allows a user to regenerate multiple reference events. The multiple reference events can then be used in the frequency synthesizer as a much faster reference clock.

According to an aspect of the invention, there is provided a detector circuit for a frequency synthesizer, said circuit comprising: an oscillator configured to generate an input signal; an input configured to receive a reference signal having a reference cycle; and a sampler configured to sample multiple reference events of the input signal per reference cycle.

Optionally, the detector circuit further comprises a digital signal processor configured to determine phase information about the input signal from the multiple reference events.

The digital signal processor is optionally configured to generate a reconstructed waveform representative of the input signal from the information.

The digital signal processor optionally determines the phase information of the input signal from the reconstructed waveform.

The digital signal processor optionally determines harmonic information of the input signal from the reconstructed waveform.

The digital signal processor optionally extracts amplitude information of the input signal from the sample multiple reference events.

The reconstructed waveform is optionally a digital waveform, and further optionally the digital waveform is reconstructed in the digital domain.

Optionally the reconstructed waveform is compared against a model waveform.

Optionally the sampler extracts 2, 3, 4, 5, 6, 7, 8, 9 or more sample multiple reference events per reference cycle.

Optionally the oscillator is a digitally controlled oscillator.

Optionally the reference signal is substantially sinusoidal.

Optionally the reference signal is substantially saw toothed.

Optionally the reference signal is an undefined signal, and further optionally the reference signal is a time varying signal, such as an audio signal, such as speech.

Optionally the sampler samples every reference event.

Optionally the reference event is one of zero-point edges, rising edges, falling edges, peaks and troughs.

Optionally the sampler is an analog to digital converter.

Optionally the sampler is an array of samplers.

According to another aspect, the invention provides a method of estimating the phase of an input signal, said method comprising the steps of:
generating an input signal using a detector circuit according to any preceding claim;
receiving a reference signal having a reference cycle to the input; and
oversampling the input signal to extract multiple reference events per reference cycle.

Optionally the method further comprises the step of generating a reconstructed signal from the multiple reference events.

Optionally the reconstructed signal is a digital signal generated in the digital domain.

Optionally the method further comprises the step of comparing the reconstructed signal to the input signal.

Optionally the method further comprises the step of determining wavesignal information of the input signal from the comparison.

Optionally the wavesignal information is one or more of phase information, harmonics or amplitude of the input signal. In particular, the wavesignal information may be more than just phase information, i.e. it may include amplitude information in addition to phase information and/or harmonics.

According to another aspect, the invention provides a frequency synthesizer circuit comprising:
a detector circuit according to the above-mentioned aspect;
a digital loop filter;
a reference oscillator for supplying the reference signal; and
a feedback mechanism for correcting the phase of the input signal based on the phase information and the reference signal.

The invention claimed is:

1. A waveform synthesizer comprising:
a controllable oscillator for generating an oscillator waveform having an oscillator cycle;
a reference input for accepting a reference signal having a reference cycle; and
a waveform detector coupled to said oscillator and said reference input, wherein said waveform detector is arranged to sample said waveform in response to said reference input and to determine waveform information about said oscillator, wherein said waveform information is operative to adjust said controllable oscillator.

2. The waveform synthesizer of claim 1, wherein said waveform detector is capable of detecting any one or more of the amplitude, frequency, phase, and harmonic level of the oscillator waveform.

3. The waveform synthesizer of claim 1, wherein said adjusting comprises changing at least one of a frequency and of a harmonic level of said controllable oscillator.

4. The waveform synthesizer of claim 1, wherein said controllable oscillator is a digitally controlled oscillator (DCO) or a class-F oscillator.

5. The waveform synthesizer of claim 1, wherein said waveform detector is configured to sample the oscillator waveform multiple times per said oscillator cycle.

6. The waveform synthesizer of claim 5, wherein said waveform detector is configured to sample the oscillator waveform multiple times per said reference cycle.

7. The waveform synthesizer of claim 1, wherein said waveform is sampled at a significant edge of said reference signal and at a short time, Delta-t, afterwards, and wherein said Delta-t is less than said oscillator cycle.

8. The waveform synthesizer of claim 1, wherein said waveform is sampled at a significant edge of said reference signal and at multiple times afterwards, and wherein delays between said sampling times are less than said oscillator cycle.

9. The waveform synthesizer of claim 1, further comprising a controller coupled to said waveform detector, said controller arranged to adjust a waveform parameters of said controllable oscillator.

10. The waveform synthesizer of claim 9, wherein said waveform parameter is at least one of a frequency and a harmonic level.

11. The waveform synthesizer of claim 1, wherein said reference cycle is at least ten times longer than said oscillator cycle.

12. The waveform synthesizer of claim 1, wherein said waveform information comprises phase, frequency and amplitude.

13. The waveform synthesizer of claim 1, wherein said waveform information comprises a harmonic level.

14. The waveform synthesizer of claim 1, wherein the waveform synthesizer is arranged to determine both frequency and amplitude information in one period of the oscillator cycle.

15. The waveform synthesizer of claim 1, wherein the waveform synthesizer is arranged to use oversampling and reconstruction of the waveform in the digital domain in order to extract phase error information.

16. The waveform synthesizer of claim 1 comprising a frequency synthesizer, wherein:
   the oscillator waveform is a variable clock, and
   said waveform detector samples said reference signal multiple times per reference cycle.

17. A frequency synthesizer comprising:
   a controllable oscillator for generating a variable clock having an oscillator cycle;
   a reference input for accepting a reference signal having a reference cycle; and
   a waveform detector coupled to said oscillator and said reference input, wherein said waveform detector samples said reference signal multiple times per reference cycle.

18. The frequency synthesizer of claim 17, wherein said reference cycle is at least ten times longer than said oscillator cycle.

19. The frequency synthesizer of claim 17, wherein each of said multiple reference events is synchronous to said variable clock.

\* \* \* \* \*